United States Patent [19]

Inoue et al.

[11] Patent Number: 5,933,215
[45] Date of Patent: Aug. 3, 1999

[54] EXPOSURE APPARATUS AND DEVICE MANUFACTURING METHOD USING THE SAME

[75] Inventors: Mitsuru Inoue, Utsunomiya; Ryuichi Ebinuma, Tokyo; Kazunori Iwamoto, Utsunomiya; Eiji Osanai, Yokohama; Hiroaki Takeishi, Utsunomiya, all of Japan

[73] Assignee: Canon Kabushiki Kaisha, Tokyo, Japan

[21] Appl. No.: 08/867,355

[22] Filed: Jun. 2, 1997

[30] Foreign Application Priority Data

Jun. 6, 1996 [JP] Japan .................................... 8-165124

[51] Int. Cl.⁶ ........................... G03B 27/42; G03B 27/58; G03B 27/62
[52] U.S. Cl. .................................. 355/53; 355/72; 355/75
[58] Field of Search .................................. 355/53, 75, 72, 355/77; 356/399, 400, 401; 250/492.2; 378/34

[56] References Cited

U.S. PATENT DOCUMENTS

| | | | |
|---|---|---|---|
| 5,040,431 | 8/1991 | Sakino et al. | 74/479 |
| 5,128,975 | 7/1992 | Iwamoto et al. | 378/34 |
| 5,204,712 | 4/1993 | Bouwer et al. | 355/53 |
| 5,280,677 | 1/1994 | Kubo et al. | 33/568 |
| 5,467,720 | 11/1995 | Korenaga et al. | 108/20 |
| 5,473,410 | 12/1995 | Nishi | 355/53 |
| 5,477,304 | 12/1995 | Nishi | 355/53 |
| 5,491,534 | 2/1996 | Shiozawa | 355/69 |
| 5,524,502 | 6/1996 | Osanai | 74/490.07 |
| 5,610,686 | 3/1997 | Osanai | 355/72 |
| 5,767,948 | 6/1998 | Loopstra et al. | 355/53 |

*Primary Examiner*—Alan A. Mathews
*Attorney, Agent, or Firm*—Fitzpatrick, Cella, Harper & Scinto

[57] ABSTRACT

A scanning exposure apparatus wherein a portion of a pattern of an original is projected onto a substrate through a projection optical system and the original and substrate are scanningly moved relative to the projection optical system, whereby the pattern of the original is transferred onto the substrate. The apparatus includes an original stage for holding the original, a base for supporting the original stage, and a supporting device for supporting the base at three positions, through a damper device and a pillar device. The three positions define an approximately isosceles triangle, and the scan direction is parallel to a straight line that connects a point of intersection of isosceles sides of the triangle and a gravity center thereof.

17 Claims, 7 Drawing Sheets

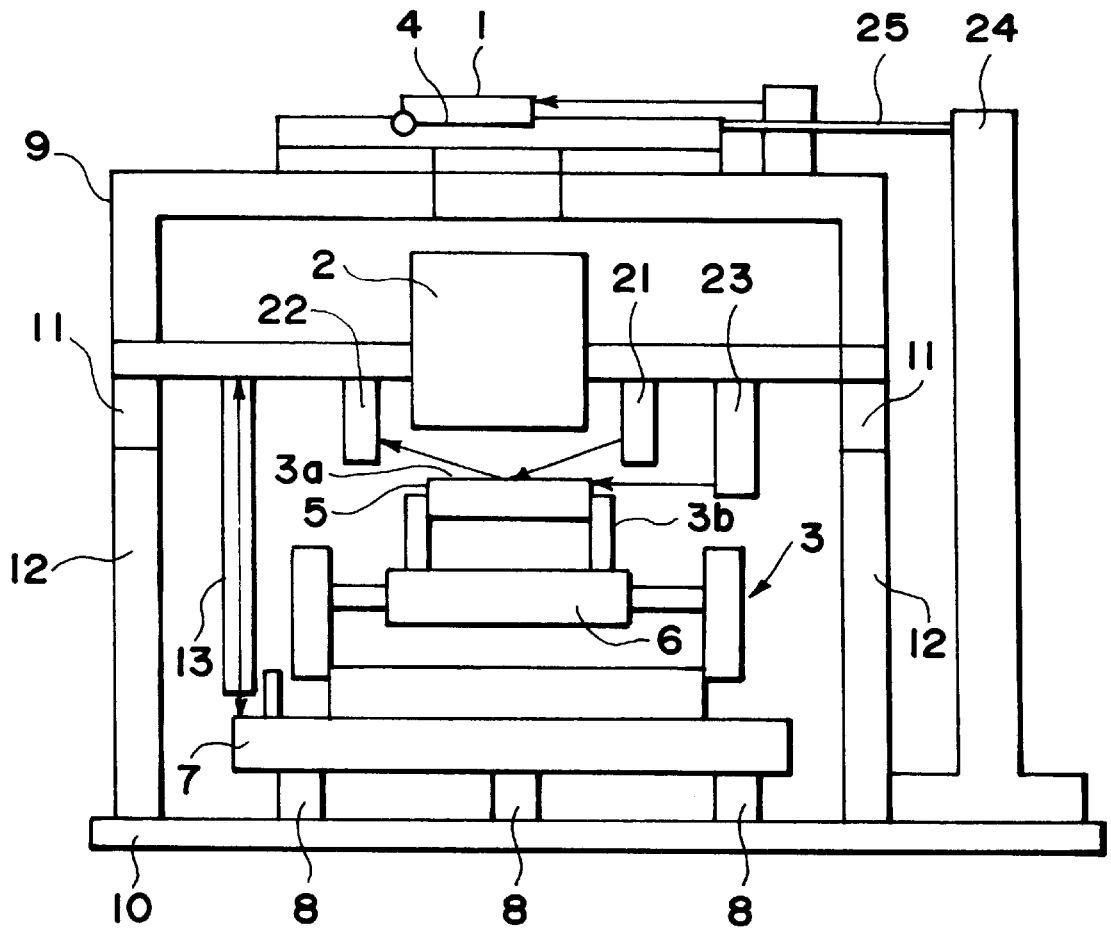
F I G. 1

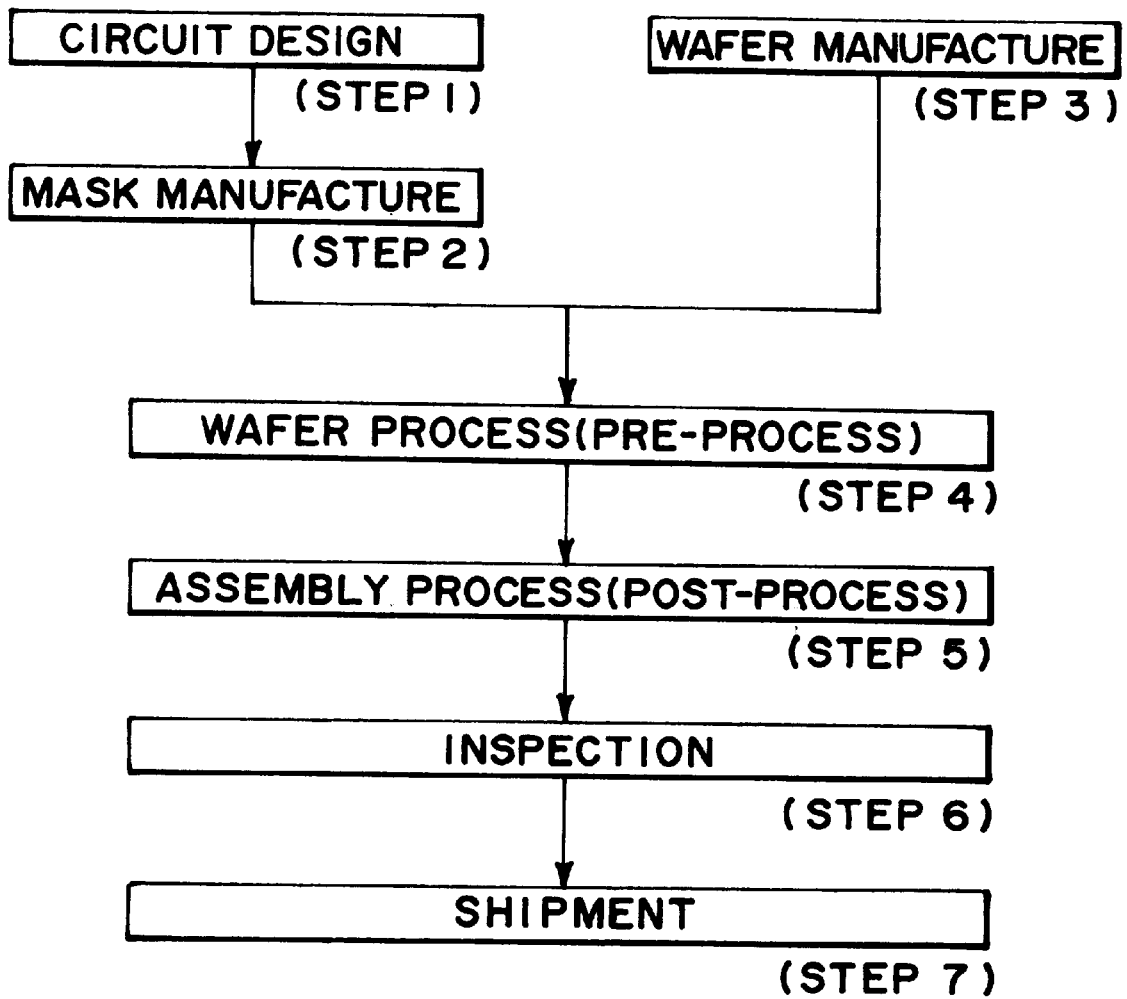
F I G. 6

EXPOSURE APPARATUS AND DEVICE MANUFACTURING METHOD USING THE SAME

FIELD OF THE INVENTION AND RELATED ART

This invention relates to an exposure apparatus for use in the manufacture of semiconductor devices, for example, for lithographically printing a design pattern on a substrate. In another aspect, the invention is concerned with a device manufacturing method which uses an exposure apparatus such as above.

As for such an exposure apparatus, there are a projection exposure apparatus (stepper) for printing a pattern of an original onto different exposure areas on a substrate such as a wafer, sequentially, through a projection optical system while moving the substrate stepwise, and a scanning exposure apparatus for printing a pattern of an original such as a mask onto a substrate while synchronously moving the original and the substrate relative to a projection optical system.

Further, a step-and-scan type exposure apparatus has been recently proposed for higher precision printing of a fine pattern, as disclosed in U.S. Pat. Nos. 5,473,410, 5,477,304 and 5,491,534, for example. In such an exposure apparatus, stepwise motion and scanning exposure as mentioned above are repeated, to perform high precision printing onto plural regions on a substrate. Since, in this type of exposure apparatus, with a restriction by a slit, only a portion relatively near an optical axis of a projection optical system is used, higher precision and wider frame size printing of a fine pattern are enabled.

SUMMARY OF THE INVENTION

However, in such a step-and-scan type exposure apparatus or in any other exposure apparatus for which high precision printing is required, positional alignment between an original and a substrate should be improved to completely utilize the performance of a projection optical system and to increase the exposure precision significantly.

It is an object of the present invention to provide a novel technique for use in an exposure apparatus or in a device manufacture, for improving positional alignment between an original and a substrate.

More specifically, it is a first object of the present invention to modify the relation between support for a projection optical system, an original or a substrate, for example, and a scan direction of the substrate, and to avoid or reduce unwanted deformation of support means resulting from movement of a substrate stage during scan exposure.

It is a second object of the present invention to avoid or reduce deterioration of precision for measurement of a positional interrelation among a projection optical system, an original and a substrate, attributable to deformation of such support means, to thereby assure high precision control of the positional interrelation.

It is a third object of the present invention to reduce heat generation resulting from movement of a substrate stage, to assure temperature stabilization and to thereby avoid or reduce degradation of exposure precision due to a non-uniform temperature or a variation in temperature.

It is a fourth object of the present invention to assure high precision movement of a substrate in a scan direction during a scanning exposure process, with a simple structure.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and sectional side view of an exposure apparatus according to an embodiment of the present invention.

FIG. 6 is a flow chart for explaining sequences of microdevice manufacturing processes.

DESCRIPTION OF THE PREFERRED EMBODIMENTS

Figure 2:
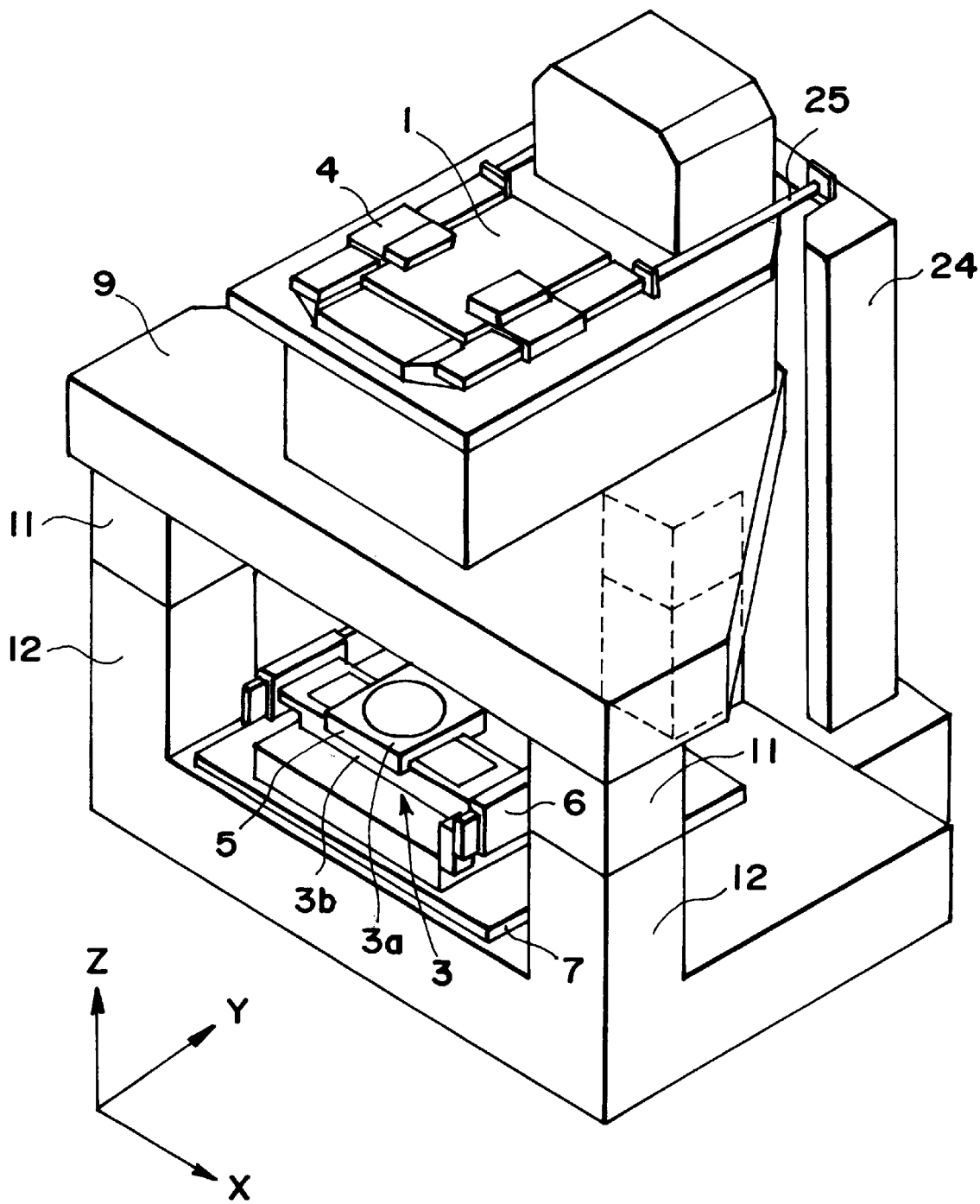
FIG. 2 is a perspective view of the exposure apparatus of FIG. 1.

Preferred embodiments of the present invention will be described with reference to the drawings. FIG. 1 is a schematic and sectional side view of an exposure apparatus according to an embodiment of the present invention. FIG. 2 is a perspective view of the outside appearance of the exposure apparatus. As shown in these drawings, in this embodiment, the invention is applied to a step-and-scan type exposure apparatus wherein a portion of a pattern of an original, placed on a reticle stage 1, is projected onto a wafer, placed on an X-Y stage 3, through a projection optical system 2. The reticle and the wafer are moved (scanned) synchronously in the Y direction relative to the projection optical system 2, whereby the pattern of the reticle (original) is transferred to the wafer (substrate to be exposed). Such scanning exposure is repeatedly effected to different areas on the wafer and, to this end, stepwise motion is performed together with the scan exposure.

The reticle stage can be moved in the Y direction by means of a linear motor 4. An X stage 3a of the X-Y stage 3 can be moved in the X direction by means of a linear motor 5, while a Y stage 3b can be moved in the Y direction by means of a linear motor 6. For a synchronous scan of the reticle and the wafer, the reticle stage 1 and the Y stage 3b are moved in the Y direction at a constant speed ratio (e.g., 4:1). Also, the stepwise motion in the X direction is performed by using the X stage 3a.

The X-Y stage 3 is disposed on a stage base 7, and the stage base 7 is supported on a base table 10 at three positions, through three dampers 8. The reticle stage 1 and the projection optical system 2 are mounted on a barrel base 9, which is supported on the base table at three positions, through supporting means that comprises pairs of dampers 11 and pillars 12. Each damper 8 comprises an active damper, which functions to actively suppress or isolate vibration in six axis directions. However, a passive damper may be used in place thereof or, alternatively, the support may be provided without the use of a damper.

Figure 3:
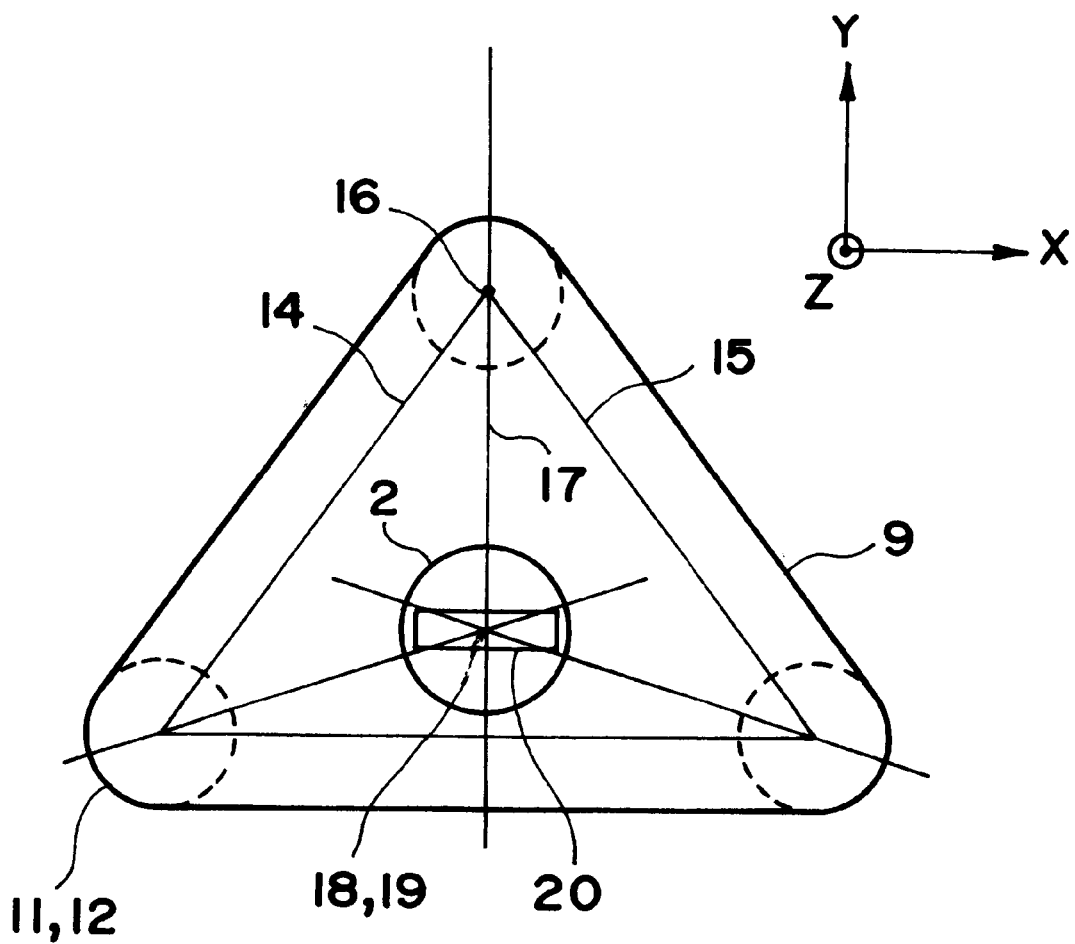
FIG. 3 is a schematic view for explaining a positional relationship of a damper (support pillar) of the apparatus of FIG. 1, a scan direction for scanning exposure, a projection exposure apparatus, and exposure light used, as viewed from the above.

FIG. 3 is a schematic view for explaining the positional interrelation of dampers 11 (or pillars 12), the scan direction during scanning exposure, projection optical system 2, and exposure light, as viewed from above. As shown in this drawing, the three support points for the barrel base 9 provided by the dampers 11 and pillars 12, define an approximately isosceles triangle. The scan direction Y is parallel to a straight line 17, which connects the gravity center 18 of the triangle and the intersection point between the isosceles sides of the triangle. Also, the gravity center 18 is substantially aligned with the gravity center 19 of the projection optical system 2. Denoted at 20 in the drawing denotes a section of exposure light which is formed with a slit-like shape. The lengthwise direction of the slit shape corresponds to a direction (X direction) perpendicular to the scan direction. Two of the three dampers 11 are placed in a front portion of the apparatus, while the remaining one is placed in a rear portion of the apparatus. A path for introduction of a wafer into the apparatus is defined, from the front portion of the apparatus and between the two pillars 12 disposed in the front portion of the apparatus.

Figure 5:
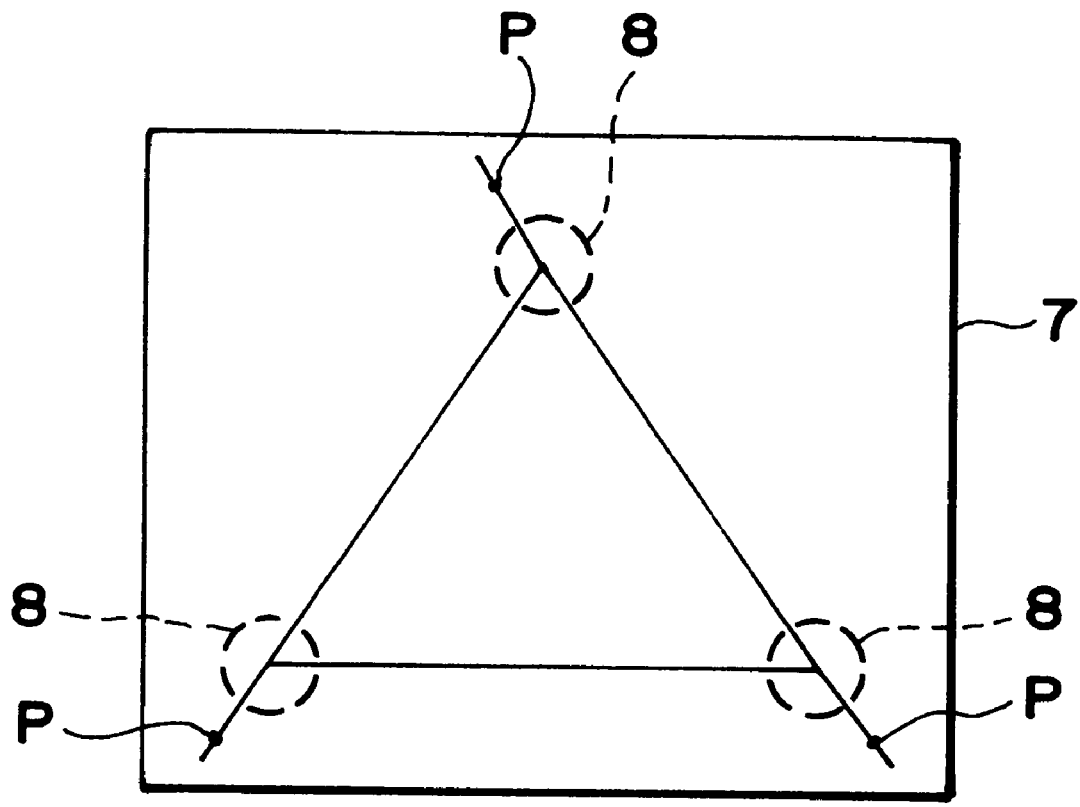
FIG. 5 is a schematic view for explaining a positional relationship of a support point for a stage base of the apparatus of FIG. 1 and a measurement point for the stage base.

The exposure apparatus further includes distance measuring means 13 such as a laser interferometer or a microencoder, for example, for measuring the distance between the barrel base 9 and the stage base 7 in the Z direction, at three points. As shown in FIG. 5, the three measurement points P upon the stage base 7 are, with respect to the measurement direction, on the elongations of three sides of a triangle as defined by the three support points provided by the dampers 8.

Alternatively, distance measurement may be performed while taking into account the magnitude of deformation, at these measurement points, of the stage base 7 resulting from movement of the X-Y stage 3, which can be measured beforehand.

Further, as shown in FIGS. 1 and 2, the exposure apparatus is further equipped with a reactive force receiving mechanism 24 for receiving a reaction force caused in the scan direction as a result of scan movement (acceleration or deceleration) of the reticle stage 1, as well as a connecting member 25. The reactive force receiving mechanism 24 is supported by the base table, independently from the barrel base 9.

With the structure described above, a wafer is conveyed and fed onto the X-Y stage 3 by conveying means (not shown), along a conveying path defined between the two pillars 12 in the front portion of the apparatus. After a predetermined alignment procedure is completed, in the exposure apparatus, scanning exposure and stepwise motion are repeated, and a pattern of the reticle is lithographically transferred onto different exposure areas on the wafer. During scan exposure, the reticle stage 1 and the Y stage 3b are moved in the Y direction (scan direction) at a predetermined speed ratio, whereby the pattern of the reticle is scanned with slit-like exposure light. Also, the wafer is scanned with a projected image of it, whereby the pattern of the reticle is printed on a predetermined exposure area on the wafer. After scan exposure of one exposure area is completed, the X stage 3a is moved in the X direction (wafer stepwise motion), whereby another exposure area is positioned with respect to the scan exposure start position. Scan exposure of that exposure area is then performed. In order that sequential exposures of plural exposure areas of the wafer are performed efficiently through the combination of stepwise motion in the X direction and scan exposure movement in the Y direction, preferably, placement of the exposure areas, scan direction (positive or negative in the Y direction), and order of exposures of the exposure areas, for example, are predetermined.

As the reticle stage 1 moves during the scan exposure operation, the gravity center thereof shifts and, thus, the tilt or the state of deformation of the barrel base 9 changes. However, as described, the supporting points for the barrel base 9 define an isosceles triangle, and the scan direction Y is parallel to the straight line 17. Additionally, the gravity center of the isosceles triangle coincides with the gravity center of the projection optical system 2. Therefore, the gravity center of the reticle stage 1 passes substantially along the straight line 17. As a result, tilt of the barrel base 9 resulting from the movement of the reticle stage 1 comprises a component in the Y (Z) direction only. It does not incline in the X direction. Further, the quantity of deformation of the barrel base 9 is symmetric with respect to the straight line 17. Thus, since, even with such deformation, the slit shape of the exposure light is still perpendicular to the scan direction, an adverse effect of any tilt in the Y direction can be removed simply by adjusting the wafer position in the Z direction. If, on the other hand, the barrel base 9 is inclined in the X direction, since the slit shape 20 is elongated in the X direction, it is very difficult to remove the effect of such tilt.

Further, since the barrel base 9 is supported at three points, a positional interrelation of the position of the reticle stage 1, the amount of deformation of the barrel base at respective points, and the positions of the support points are determined definitely. Therefore, as compared with a four-point support system, better reproducibility is assured with regard to deformation. Thus, when deformation of barrel base 9 due to movement of the reticle stage 1 should be taken into account or should be corrected, it can be done with high precision. For example, as shown in FIG. 1, whether or not the wafer is placed at the focus position of the projection optical system 2 can be discriminated by projecting light to the wafer in an oblique direction, from light projecting means 21 fixed to the barrel base 9 and by detecting the position of reflected light therefrom through light receiving means 22. In such a case, an accurate focus position detection can be done while taking into account the exact amount of deformation of the barrel base 9. Further, as regards the measurement with the laser interferometer 23 for detection of the wafer position in the X, Y and θ directions, it may be performed precisely while taking into account the deformation amount of the barrel base 9.

Further, during scan exposure or stepwise motion, the barrel base 9 or the stage base 7 may tilt as a result of movement of the reticle stage 1 or of the X-Y stage 3. If this occurs, it is necessary to correct the same. To this end, by using the distance measuring means 13, the distance between the barrel stage 9 and the stage base 7 may be measured, in the vicinity of their three support points. Here, the measurement points upon the stage base 7 are, with respect to its measurement direction, on straight lines each passing through a tip of the triangle, defined by the three support points, and a middle point of the side adjacent to that tip. At these measurement points, the amount of deformation of the reticle stage 1 or of the X-Y stage 3 is so small that it can be disregarded, and measurement may be performed without taking into account the amount of deformation.

If, on the other hand, the deformation is of an amount that cannot be disregarded, such deformation may be measured beforehand in connection with the position of the reticle stage 1 or X-Y stage 3. Then, an exact distance between the barrel base 9 and the stage base 7 can be measured precisely, while taking into account the amount of such deformation. On that occasion, because of the three-point support as described, reproducibility of deformation is good and, thus, the amount of deformation can be reflected precisely.

Figures 4A, 4B:
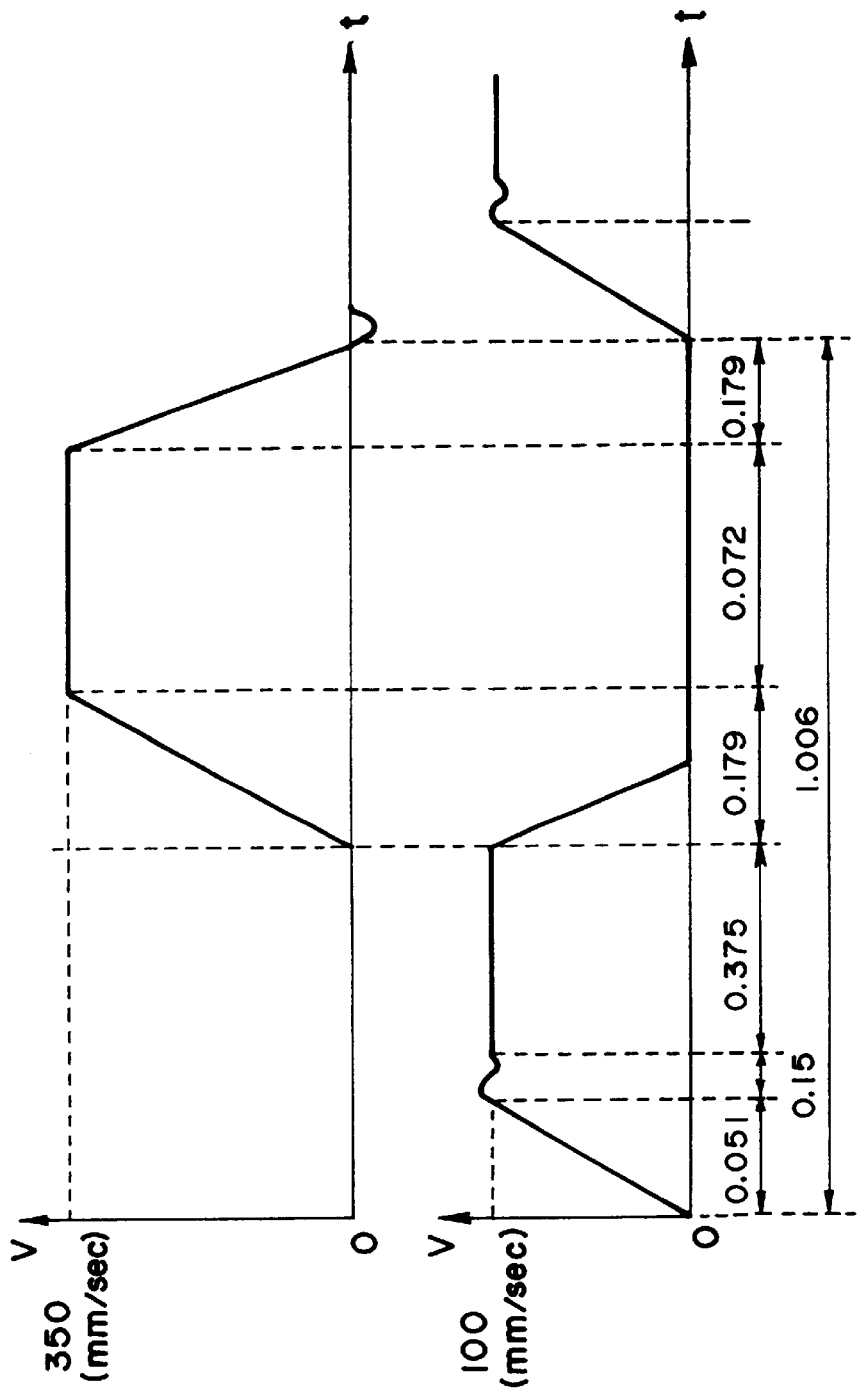
FIGS. 4(a) and 4(b) are graphs for explaining changes with time of movement speeds of an X stage and of a Y stage, of the apparatus of FIG. 1, during stepwise motion and scan exposure.

FIGS. 4(a) and 4(b)) are graphs for explaining an example of changes with time of movement speeds of X stage 3a and Y stage 3b during stepwise motion and scanning exposure. As the acceleration of the Y stage starts, after an elapse of an acceleration period of 0.051 sec. and a regulation period of 0/05 sec., the Y stage moves at a constant speed of 100 mm/sec for a period of 0.375 sec. In this constant-speed movement period, the exposure process is performed. After this exposure period, the Y stage is decelerated and, additionally, acceleration of the X stage is initiated to perform stepwise motion. After the stepwise motion is completed, acceleration of the Y stage is initiated again in a similar way. In this manner, motion of the X and Y stages is repeated, such that the pattern of the reticle is printed onto different areas on the wafer sequentially through scan exposures.

It is now assumed that the X stage has a weight of 30 Kg, and the Y stage has a weight of 60 Kg, and that acceleration and deceleration such as shown in FIGS. 4(a) and 4(b) are to be performed. If, in that case, the conditions are such that the largest acceleration of the X and Y stages is 0.2 G; the highest scan speed is 100 mm/sec.; the highest stepwise motion speed is 350 mm/sec.; the regulation period is 0.15 sec.; the exposure view angle (size of the exposure range for each exposure area) is 32.5×25 (mm); the scan distance is 37.5 (32.5+5) mm; the thrust constant of the linear motor for moving the X and Y stage is 20 N/A; then duties Dy and Dx at acceleration and deceleration during scan motion and stepwise motion are as follows:

$Dy = 0.051 \times 2/1.006 = 0.101$ $Dx = 0.179 \times 2/1.006 = 0.356$

The quantities Q1y and Q1x of heat generation of the Y stage and X stage are:

$Q1y = \{(60 \times 9.8 \times 0.2)/(20 \times 2)\}^2 \times 5 \times 2 \times 0.101 = 8.73 \ [w]$ $Q1x = \{(30 \times 9.8 \times 0.2)/20\}^2 \times 5 \times 0.35 = 15.39 \ [w]$ The sum of the generated heat quantities is 24.12 [w]. If, on the other hand, the X stage is moved in the scan direction and the stepwise motion is provided by the Y stage (the remaining portion is similar to that described above), the quantities Q2y and Q2x of the X and Y stages on that occasion are:

$$Q2x = \{(30 \times 9.8 \times 0.2)/20\}^2 \times 5 \times 0.101 = 4.37 [w]$$

$$Q2y = \{(60 \times 9.98 \times 0.2)/(20 \times 2)\}^2 \times 5 \times 2 \times 0.356$$
$$= 30.77 [w]$$

The sum of the generated heat quantities is 35.14 [w]. Thus, by using the lower Y stage of heavier weight for the scan motion of smaller duty, it is possible to reduce the quantity of heat generation. Also, as described, by setting the movement direction of the upper X stage of lighter weight in a direction perpendicular to the scan direction and by performing correction of the drive error of the reticle stage 1 in the component perpendicular to the scan direction (or by performing offset adjustment movement therefor) while using that X stage, the precision of correction or the like can be enhanced significantly. Therefore, it is a possible alternative to provide the reticle stage 1 only with one-direction driving means for movement in the scan direction only.

In this embodiment, as has been described above, a projection optical system and a stage for the original are disposed on bases, which are supported through dampers and pillars at three points. Also, a gravity center of a triangle defined by these three points and a gravity center of the projection optical system are made in alignment with each other. This assures good reproducibility of deformation of the base attributable to movement of the original stage, such that it is possible to avoid the effect of deformation precisely. Moreover, since the original stage is moved, on the base, parallel to a straight line that connects the gravity center and the point of intersection of isosceles sides of the triangle, any tilt or deformation of the base is prevented from adversely and largely affecting the slit direction of the slit-like exposure light. Such tilt or deformation will be produced mainly in a direction perpendicular to the slit direction. Thus, it is easy to avoid the effect of that. Two of the three points of the triangle may be placed in the front portion of the apparatus while the remaining one point may be placed in the rear portion of the apparatus, such that conveyance of a substrate into the apparatus may be performed by passing it between the two support pillars placed at the two points in the front portion. This easily assures a path of substrate conveyance and enables effective utilization of space.

Further, a substrate stage is provided, and measurement points for the position of the three-point supported base or for the distance thereto are placed on straight lines each passing a tip of the triangle, defined by these three points, and a middle point of a side juxtaposed thereto. This enables measurement based on measurement points where only a small deformation of the base occurs due to movement of the substrate stage. Thus, high precision measurement is assured. Alternatively, such measurement may be performed while taking into account the amount of deformation of the base resulting from movement of the substrate stage, having been measured beforehand. Also, this is effective to assure high precision measurement.

Further, since a second stage for moving a substrate in a direction perpendicular to the scan direction, for stepwise motion, is mounted on a first stage for moving the substrate in the scan direction for synchronous scanning, the amount of heat generation due to the movement of the substrate stage is reduced. Thus, temperature stabilization is ensured and, therefore, degradation of exposure precision resulting from a non-uniform temperature or a temperature variation can be avoided. Additionally, since correction in a direction perpendicular to the scan direction can be made by means of the second stage, the original stage can be provided by a simple structure with driving means for one axial direction only.

Next, an embodiment of a device manufacturing method which uses an exposure apparatus such as described above, will be explained.

FIG. 6 is a flow chart of a procedure for the manufacture of microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, durability check and so on for the semiconductor devices provided by step 5, are carried out. With these processes, semiconductor devices are completed and they are shipped (step 7).

Figure 7:
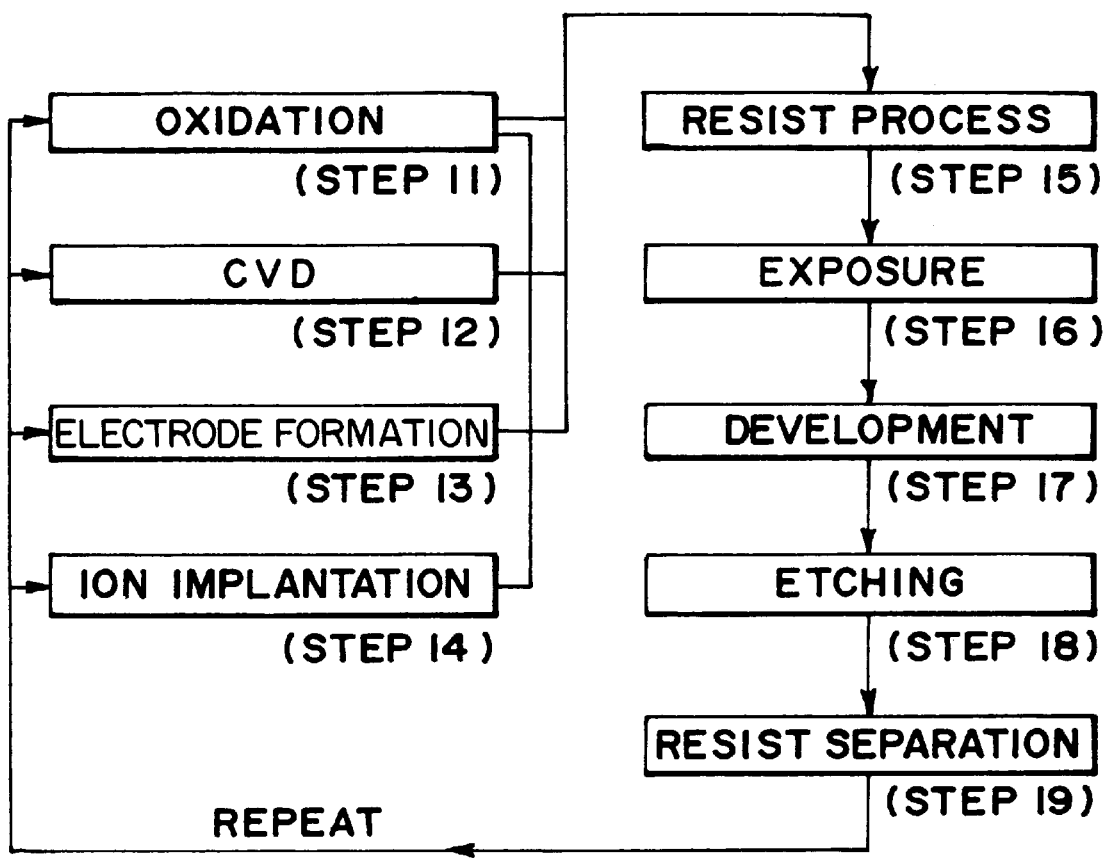
FIG. 7 is a flow chart for explaining details of a wafer process included in the sequence of FIG. 6.

FIG. 7 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask onto the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A scanning exposure apparatus wherein a portion of a pattern of an original is projected onto a substrate through a projection optical system and the original and the substrate are scanningly moved relative to the projection optical system, whereby the pattern of the original is transferred onto the substrate, said apparatus comprising:

an original stage for holding the original;

a base for supporting said original stage; and supporting means for supporting said base at three positions, through damper means and pillar means, wherein the three positions define an approximately isosceles triangle, and the scan direction is parallel to a straight line that connects a point of intersection of isosceles sides of the triangle and a gravity center thereof.

2. An apparatus according to claim 1, wherein said base supports said projection optical system as well as said original stage.

3. An apparatus according to claim 1, wherein a gravity center of the triangle is substantially aligned with a gravity center of said projection optical system.

4. An apparatus according to claim 1, wherein two of the three positions are placed in a front portion of said apparatus and the remaining one position is placed in a rear portion of said apparatus, and a path of conveyance of the substrate into said apparatus extends between two pillar members of said pillar means, disposed at the two positions in the front portion of said apparatus.

5. An apparatus according to claim 1, further comprising a reactive force receiving mechanism, supported separately from said base, for receiving a reaction force resulting from scan movement of said original stage.

6. A scanning exposure apparatus wherein a portion of a pattern of an original is projected onto a substrate through a projection optical system and the original and the substrate are scanningly moved relative to the projection optical system, whereby the pattern of the original is transferred onto the substrate, said apparatus comprising:

an original stage for holding the original;

a first base for supporting said original stage;

supporting means for supporting said first base at three positions, through first damper means and pillar means;

a substrate stage for holding and moving the substrate;

a second base, different from said first base, for supporting said substrate stage;

second damper means for supporting said second base at three positions; and measuring means for measuring a positional relationship between said second base and said first base.

7. An apparatus according to claim 6, wherein said measuring means measures a distance between said second base and said first base, at three measurement points.

8. An apparatus according to claim 7, wherein each of the three measurement points of said measuring means, upon said second base, is on a straight line corresponding to an elongation of an associated side of a triangle defined by the three points.

9. An apparatus according to claim 7, wherein said measuring means performs the measurement while taking into account the amount of deformation, at a measurement point on said second base, of said second base resulting from movement of said substrate stage, having been measured beforehand.

10. A scanning exposure apparatus wherein a portion of a pattern of an original is projected onto a substrate through a projection optical system and the original and the substrate are scanningly moved relative to the projection optical system, whereby the pattern of the original is transferred onto the substrate, said apparatus comprising:

an original stage for holding the original;

a base for supporting said original stage;

supporting means for supporting said base at three positions, through damper means and pillar means;

a first stage for moving the substrate in a scan direction for scan of the substrate; and a second stage for moving the substrate in a direction perpendicular to the scan direction, for stepwise motion thereof, wherein said second stage holds the substrate and is moved in the scan direction by said first stage.

11. A device manufacturing method comprising the steps of:

providing an exposure apparatus that includes an original stage for holding an original, a base for supporting the original stage, and supporting means for supporting the base at three positions through damper means and pillar means, wherein the three positions define an approximately isosceles triangle, and a scan direction is parallel to a straight line that connects a point of intersection of isosceles sides of the triangle and a gravity center thereof; and transferring a pattern formed on the original onto a wafer by use of the exposure apparatus.

12. A scanning exposure apparatus wherein a portion of a pattern of an original is projected onto a substrate through a projection optical system and the original and the substrate are scanningly moved relative to the projection optical system, whereby the pattern of the original is transferred onto the substrate, said apparatus comprising:

a base for supporting said projection optical system; and supporting means for supporting said base at three positions, through damper means and pillar means, wherein the three positions define a triangle having a gravity center substantially aligned with a gravity center of said projection optical system, as viewed from above.

13. A scanning exposure apparatus wherein a portion of a pattern of an original is projected onto a substrate through a projection optical system and the original and the substrate are scanningly moved relative to the projection optical system, whereby the pattern of the original is transferred onto the substrate, said apparatus comprising:

a base for supporting said projection optical system; and supporting means for supporting said base at three positions, through damper means and pillar means, wherein two of the three positions face one side of said apparatus, while the remaining one faces another side of said apparatus, and a path of conveyance of the substrate into said apparatus extends between pillar members of said pillar means, disposed at the two positions in a front portion of said apparatus.

14. A scanning exposure method wherein a portion of a pattern of an original is projected onto a substrate through a projection optical system and the original and the substrate are scanningly moved relative to the projection optical system, whereby the pattern of the original is transferred onto the substrate, said method comprising:

holding the original with an original stage;

supporting the original stage with a first base;

supporting the first base at three positions, through supporting means, first damper means and pillar means;

holding and moving the substrate by a substrate stage;

supporting the substrate stage by a second base, different from the first base;

supporting the second base at three positions with second damper means; and measuring, using measuring means, a positional relationship between the second base and the first base.

15. A scanning exposure method wherein a portion of a pattern of an original is projected onto a substrate through a projection optical system and the original and the substrate are scanningly moved relative to the projection optical system, whereby the pattern of the original is transferred onto the substrate, said method comprising:

holding the original with an original stage;

supporting the original stage with a base;

supporting the base at three positions, through supporting means, damper means and pillar means;

moving, by a first stage, the substrate in a scan direction for scan of the substrate; and moving, by a second stage, the substrate in a direction perpendicular to the scan direction, for stepwise motion thereof, wherein the second stage holds the substrate and is moved in the scan direction by the first stage.

16. A scanning exposure method wherein a portion of a pattern of an original is projected onto a substrate through a projection optical system and the original and the substrate are scanningly moved relative to the projection optical system, whereby the pattern of the original is transferred onto the substrate, said method comprising:

supporting the projection optical system by a base; and supporting the base at three positions, through supporting means, damper means and pillar means, wherein the three positions define a triangle having a gravity center substantially aligned with a gravity center of the projection optical system, as viewed from above.

17. A scanning exposure method using a projection exposure apparatus, wherein a portion of a pattern of an original is projected onto a substrate through a projection optical system and the original and the substrate are scanningly moved relative to the projection optical system, whereby the pattern of the original is transferred onto the substrate, said method comprising:

supporting the projection optical system by a base; and supporting the base at three positions, through supporting means, damper means and pillar means, wherein two of the three positions face one side of the apparatus, while the remaining one faces another side of the apparatus, and a path of conveyance of the substrate into the apparatus extends between pillar members of the pillar means, disposed at the two positions in a front portion of the apparatus.

* * * * *

UNITED STATES PATENT AND TRADEMARK OFFICE
CERTIFICATE OF CORRECTION

PATENT NO. : 5,933,215

DATED : August 3, 1999

INVENTOR(S): MITSURU INOUE, ET AL.

It is certified that error appears in the above-identified patent and that said Letters Patent is hereby corrected as shown below:

ON THE COVER PAGE AT ITEM [56] "References Cited",
The following should be inserted:

--FOREIGN PATENT DOCUMENTS

WO 96/38764   12/1996   PCT
2 290 658     01/1996   United Kingdom
0 502 578     09/1992   Europe
0 498 496     08/1992   Europe--.

Signed and Sealed this

Eleventh Day of April, 2000

Attest:

Q. TODD DICKINSON

Attesting Officer

Director of Patents and Trademarks